US006922555B1

(12) United States Patent
Mohindra

(10) Patent No.: US 6,922,555 B1
(45) Date of Patent: Jul. 26, 2005

(54) PHASE INTERPOLATION RECEIVER FOR ANGLE MODULATED RF SIGNALS

(75) Inventor: Rishi Mohindra, Milpitas, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/389,179

(22) Filed: Sep. 2, 1999

(51) Int. Cl.[7] .......................... H04B 1/26; H04B 15/00
(52) U.S. Cl. ...................... 455/314; 455/311; 455/302; 455/207; 455/308
(58) Field of Search ...................... 455/165.1, 142–144, 455/205–209, 214, 215, 302–307, 308, 309, 313–316, 323, 324; 375/260–267, 271, 324

(56) References Cited

U.S. PATENT DOCUMENTS

| 4,217,551 | A | * | 8/1980 | Entenman .................. 375/327 |
| 4,506,228 | A | * | 3/1985 | Kammeyer ................ 329/343 |
| 5,159,281 | A | * | 10/1992 | Hedstrom et al. .......... 329/312 |
| 5,596,600 | A | * | 1/1997 | Dimos et al. ............... 375/148 |
| 5,619,536 | A | * | 4/1997 | Gourgue .................... 375/316 |
| 5,701,106 | A | * | 12/1997 | Pikkarainen et al. ........ 332/100 |
| 6,097,259 | A | * | 8/2000 | Saito et al. ................. 332/103 |
| 6,317,468 | B1 | * | 11/2001 | Meyer ........................ 375/269 |
| 6,459,743 | B1 | * | 10/2002 | Lipka ......................... 375/329 |

OTHER PUBLICATIONS

By Wally H. W. Tuttlebee, "Cordless Telecommunications in Europe", The Evolution of Personal Communications, Pub. Springer–Verlag, London, 1990. pp. 211–214.

* cited by examiner

Primary Examiner—Charles Craver
(74) Attorney, Agent, or Firm—Aaron Waxler

(57) ABSTRACT

A phase interpolation receiver for receiving angle modulated radio frequency signals. The receiver comprises mixers for down-converting the received angle modulated signal to lower frequency signals, limiters, interpolation filters, and a demodulator. The mixers down-convert the received RF signal to a low IF intermediate frequency signal. The low IF intermediate frequency signal is limited. After further down-conversion to zero IF, using quadrature mixers, the limited signal is phase interpolated. The intermediate frequency is chosen such that the limited signal comprises an unwanted signal at twice the intermediate frequency that acts as a noise spreading signal for spectrally spreading of quantization noise generated by the limiters, and the cut-off frequency of the interpolation filters is chosen such that the unwanted signal and the spread quantization noise are suppressed.

20 Claims, 8 Drawing Sheets

$$v(t) = sgn\{Re[A(t)e^{j\omega_{IF}t}]\}$$

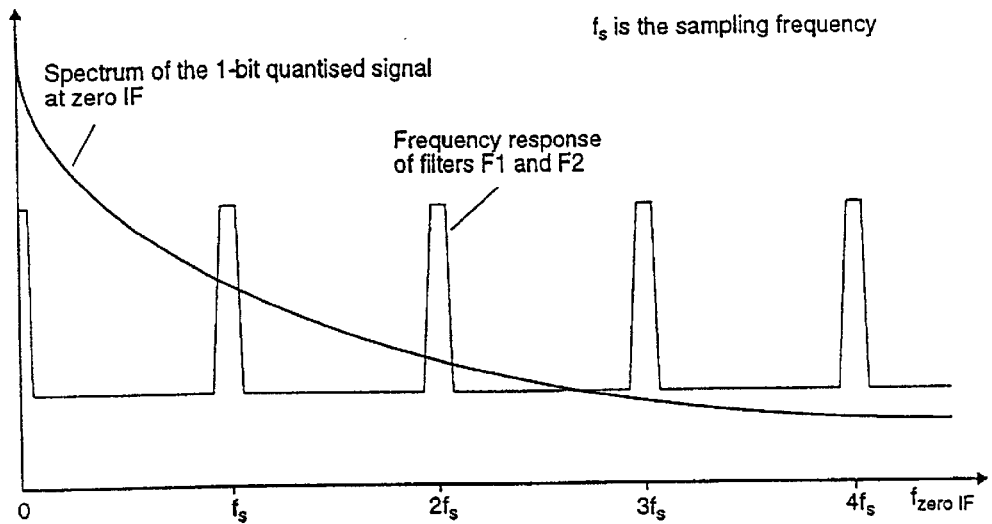
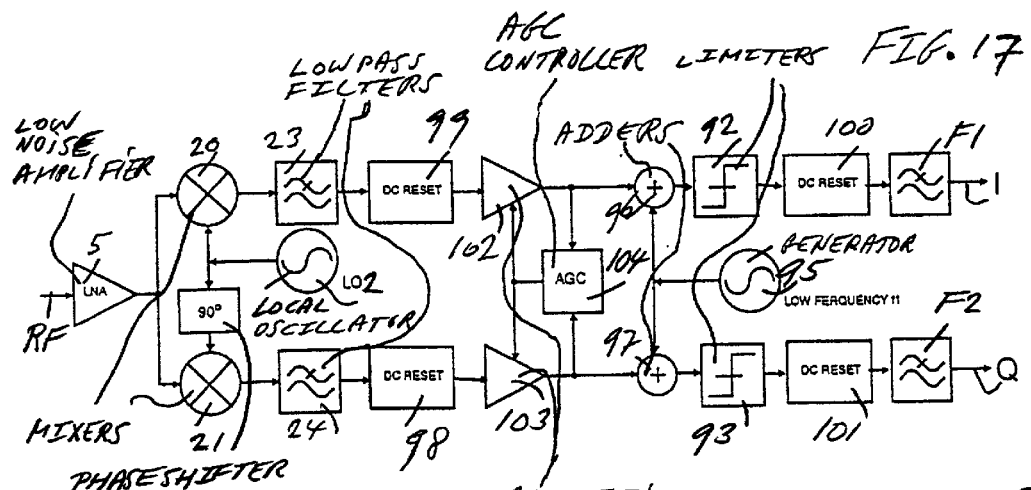
FIG. 17
FIG. 18
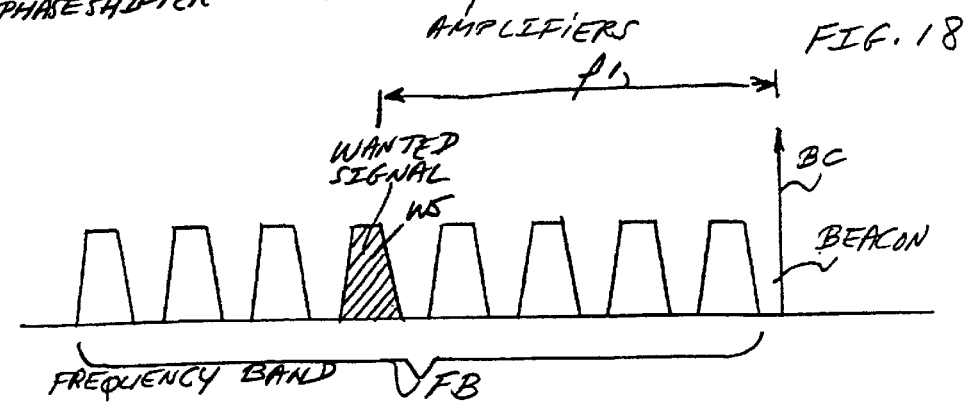
FIG. 19

PHASE INTERPOLATION RECEIVER FOR ANGLE MODULATED RF SIGNALS

BACKGROUND OF THE INVENTION

1. Field of the Invention

The present invention relates to a receiver for receiving angle modulated signals. Such a receiver can be a cordless or cellular telephone receiver, such as a DECT receiver, Digital European Cordless Telecommunications based on the ETSI DECT Standard, a PWT receiver, Personal Wireless Telecommunications based on the TR41.6 TIA Standard, a GSM receiver, Global System for Mobile Communications based on the ETSI GSM Standard, or any other receiver for angle modulated signals. In DECT, the angle modulated signals are GFSK signals, Gaussian Frequency Shift Keyed signal. In PWT, the angle modulated signals are π/4 DQPSK signals, Differential Quadrature Phase Shift Keyed Signals.

2. Description of the Related Art

In the handbook "Cordless Telecommunications in Europe", W. H. Tuttlebee, Springer Verlag, 1990, pp. 211–214, a superheterodyne receiver architecture, and a direct conversion (zero IF) receiver architecture are disclosed, with a demodulator that is coupled to a noise limiting intermediate frequency filter. A high intermediate frequency is considered desirable to simplify the task of separating an image frequency from a wanted frequency in a frequency band. The choice of the intermediate frequency is also influenced by the technology available in relation to the modulation and signal bandwidth. In DECT, for instance, the signal band is in the order of 1 MHz. In receivers with so-called SAW filters, Surface Acoustic Wave filters, for DECT, usually the intermediate frequency is much higher than the signal bandwidth. Double superheterodyne architectures with two intermediate frequencies apply two stage IF filtering. In such an architecture, the first IF filter stage needs to have enough selectivity to provide adequate rejection of the image frequency of the second IF conversion stage. The direct conversion architecture is a one stage single conversion from RF to zero IF, the RF signal being mixed with in-phase and quadrature components of a local oscillator.

In other conventional digital communication receivers that use hard limited IF signals with FM discriminators, the IF frequency is normally much larger than the signal bandwidth in order to keep distortion in the demodulated signal small. For example, in DECT, which uses constant envelope GFSK modulation, hard limiting is usually done at an IF of about 10 MHz. In PWT, that uses π/4 DQPSK modulation, there is a similar requirement, with an additional need of a much larger linear range of the FM discriminator. Limiting is required in order to keep the input dynamic range of the demodulator small. It is much cheaper and easier to implement, as compared to applying automatic gain control (AGC). Another advantage of hard limiting is that the 1 bit quantized signal can be directly processed digitally, without the need of an A/D converter. Furthermore, it is advantageous to keep the IF frequency very low after the channel selectivity filtering. The demodulation can be fully integrated or even digitally done at lower sampling rates. But then, complicated distributed AGCs are neded to limit the dynamic range of the channel filters and the FM discriminator. In addition thereto, DC resetting techniques can be used to drastically reduce the DC offset created by LO leakage. Known zero-IF receivers for PWT with π/4 DQPSK modulation are even more complicated due to the non-constant envelope of the signal. Limiting cannot be used in zero IF receivers as the harmonics produced by them fold back into the wanted signal band. The effect is that the modulation phase is quantized into π/4, 3π/4, 5π/4, and 7π/4 by hard limiting, i.e., the phase quantization error is π/4. This is too coarse for achieving reasonable receiver sensitivity in terms of BER at a given Carrier to Noise ratio. Techniques have been proposed wherein four or more hard limited multi-phase zero IF signals are used to reduce the basic phase quantization error. The multiphase signals are generated using a linear combination of the basic non-limited I and Q quadrature signals. The phase quantization can be further reduced by using complicated architectures with high-speed counters that measure the intervals between zero crossings of the limited signals.

SUMMARY OF THE INVENTION

It is an object of the invention to provide a different architecture of a receiver for receiving angle modulated radio frequency signals combining the advantages of limiting the IF-signal signal and of having a zero-IF.

It is another object of the invention to provide a simple architecture that can be implemented easily.

It is still another object of the invention to provide analog and digital variants of such parts of such an architecture.

In accordance with the invention, a receiver for receiving angle modulated signals is provided comprising:

first down-conversion means for down-converting said received angle modulated radio frequency signal to an intermediate frequency angle modulated signal;

limiting means for generating a limited signal from said intermediate frequency angle modulated signal;

second down-conversion means for down-converting said limited signal to an in-phase and a quadrature zero intermediate frequency signal;

low pass interpolation filtering means for interpolating said in-phase and quadrature zero intermediate frequency signals; and demodulation means for producing a demodulated signal from said interpolated in-phase and quadrature zero intermediate frequency signals, said intermediate frequency being chosen such that said limited signal comprises an unwanted signal at twice said intermediate frequency that acts as a noise spreading signal for spectrally spreading of quantization noise generated by said limiting means, and a cut-off frequency of said low pass interpolation filtering means being chosen such that said unwanted signal and said spread quantization noise are suppressed.

Alternatively, the receiver can be based on a direct conversion zero-IF receiver in which quantization noise due to limiting is spectrally spread by a low frequency signal injected after down-conversion to zero-IF.

Alternatively, the receiver can be a direct conversion zero-IF receiver in which quantization noise due to limiting is spectrally spread by a beacon signal that is present in the received radio frequency signal, outside a frequency band of desired signals.

The invention is based upon the insight that hard-limiting and zero-IF can advantageously be combined by using an internal or external quantization noise spreading signal, the internal spreading signal being the $2f_{IF}$ signal, and the external signal being the low frequency injection signal or the beacon signal.

Preferably, an internal spreading signal is used, and the limiting means is a hard limiter that provides a 1-bit quantization.

Such an embodiment combines the advantages of both zero IF and hard-limiting, using phase interpolation and spreading of the quantization noise. By having a higher frequency noise spreading unwanted signal, the $f_{2IF}$ signal, along with the zero IF signal, the 1-bit quantization noise is spread to higher frequencies, and much less of this noise actually folds back into the wanted zero IF signal band. The unwanted signal and higher frequency quantization noise are filtered before demodulation, using a low pass filter. The low pass filter actually performs a phase interpolation to give quite accurate and quite continuous modulation phase at zero IF.

Mathematically, hard limiting is equivalent to the signum function sgn, and since sgn(xy)=sgn(x)sgn(y), limiting before of after mixing produces the same result. The noise spreading by the $2f_{IF1}$ term is therefore independent of hard limiting being performed before or after mixing of the low-IF signal to a zero-IF signal.

Instead of hard-limiting, soft limiting can be done, with a logarithmic gain amplifier, for instance. Then, an additional A/D-converter is needed for generating a digital output stream of words of at least 2 bit.

Preferably, a local oscillator signal for the down-conversion from low-IF to zero-IF, that is generated by a local oscillator means, is a square wave signal. This has the advantage that signal processing can be done in the digital domain, without the need of an additional analog-to-digital converter. Applying a sine wave, at the other hand, requiring additional analog-to-digital converters, has the advantage that for phase modulation the signal constellation of the limited signal is not distorted so that there is no demodulation phase error.

Preferably, the low pass interpolation filtering means are digital filtering means of a cascade of a moving average filter, a down sampler, and a reduced sampling rate digital filter such as a Finite Impulse Response (FIR) raised cosine filter. Herewith, a simple and robust embodiment is provided, with reduced power consumption due to the reduced sampling rate digital filter.

BRIEF DESCRIPTION OF THE DRAWING

FIG. 17 shows aliasing in the digital low pass phase interpolation filter.

FIG. 18 shows a one step down conversion zero-IF receiver embodiment of the present invention.

FIG. 19 shows a beacon signal embodiment of a zero-IF receiver according to the present invention.

Throughout the figures the same reference numerals are used for the same features.

DESCRIPTION OF THE PREFERRED EMBODIMENT

Figure 1:
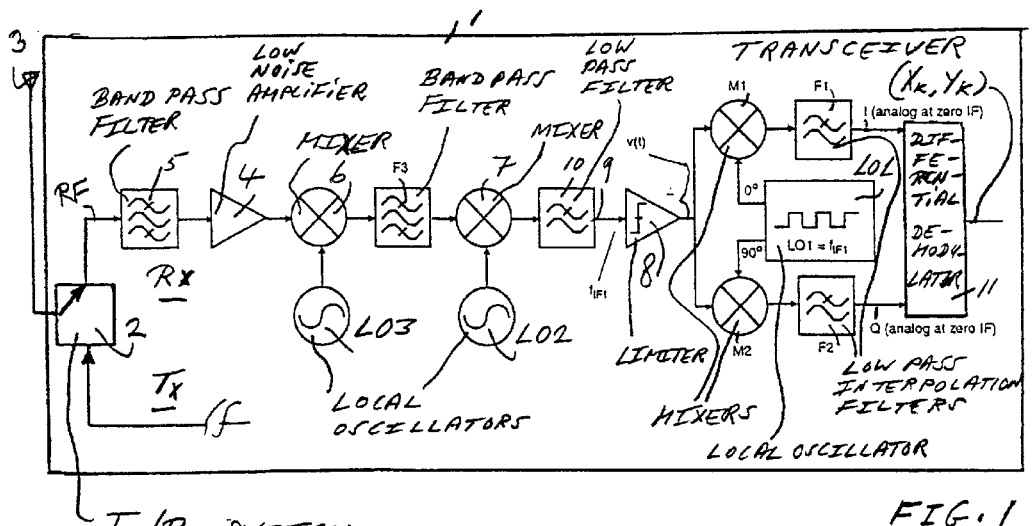
FIG. 1 is a block diagram of a transceiver with a first embodiment of a receiver according to the present invention.

FIG. 1 is a block diagram of a transceiver 1 with a first embodiment of a receiver Rx according to the present invention. The receiver Rx is a double super heterodyne receiver with three-step down-conversion from RF to zero-IF or base band. The transceiver, a DECT or a PWT receiver, for instance, comprises a Tx/Rx switch 2 for coupling the receiver Rx to an antenna 3. The Tx/Rx switch 2 is further coupled to a transmit branch Tx that is not shown in detail here. The receiver Rx comprises a low noise RF amplifier 4 that is coupled to the Tx/Rx switch 2 through an RF band pass filter 5. The RF band pass filter 5 receives an angle modulated radio frequency signal RF at the antenna 3. The low noise amplifier 4 is coupled to first down-conversion means, a mixer 6, and a mixer 7, the mixer 6 being coupled to a local oscillator LO3, and the mixer 7 being coupled to a local oscillator LO2. The mixer 6 is coupled to the mixer 7 through a band pass filter F3. The receiver Rx comprises a limiter 8 for a generating a limited signal v(t) from an intermediate frequency angle modulated signal $f_{IF1}$ appearing at an output 9 of a low pass filter 10. In the embodiment shown, the limiter 8 is a hard limiter. The receiver Rx comprises second down-conversion means, mixers M1 and M2. The mixers M1 and M2 are coupled to a local oscillator LO1 that provides ninety degrees phase shifted oscillator signals to the mixers M1 and M2, respectively. At output side, the mixers M1 and M2 are coupled to low pass interpolation filters F1 and F2, respectively, the filters F1 and F2 providing analog quadrature signals, an in-phase signal I and a quadrature signal Q, at zero-IF. The signals I and Q are supllied to a differential demodulator 11 providing demodulated symbols $(X_k, Y_k)$. For π/4 DQPSK, as in a PWT system, the differential demodulator 11 generates the demodulated signals $(X_k, Y_k)$ in accordance with the following equations:

$$X_k = -\text{sgn}[\sin(\Delta\theta(k))]$$

$$Y_k = -\text{sgn}[\cos(\Delta\theta(k))]$$

$$\sin(\Delta\theta(k)) = \frac{Q(k)I(k-1) - I(k)Q(k-1)}{|A(k)||A(k-1)|}, \text{ and}$$

-continued $$\cos(\Delta\theta(k)) = \frac{I(k)I(k-1)\_Q(k)Q(k-1)}{|A(k)||A(k-1)|},$$

where $|A(k)|=\text{sqrt}[(I^2(k)+Q^2(k))]$, sqrt being a square root function. $|A(k)|$ is the magnitude of the modulation vector or carrier envelope, and $\Delta\theta(k)$ is change in carrier phase, i.e, modulation vector from $k-1^{th}$ symbol to $k^{th}$ symbol. Since the magnitude of the carrier envelope $|A(k)|$ is always positive, it does not influence the values of $X_k$ and $Y_k$. Hence the envelope distortion does not affect receiver sensitivity if all the channel noise is added prior to this distortion. Most of the noise power comes from the front end RF section and therefore the signal plus noise undergo the envelope distortion, without affecting the resultant S+N polarity. The noise power added after the mixing to zero IF, has to be kept comparatively very small, as this noise can change the distorted S+N polarity. Demodulation of a DECT GFSK signal can be done differentially as in π/4 DQPSK PWT.

Figure 2:
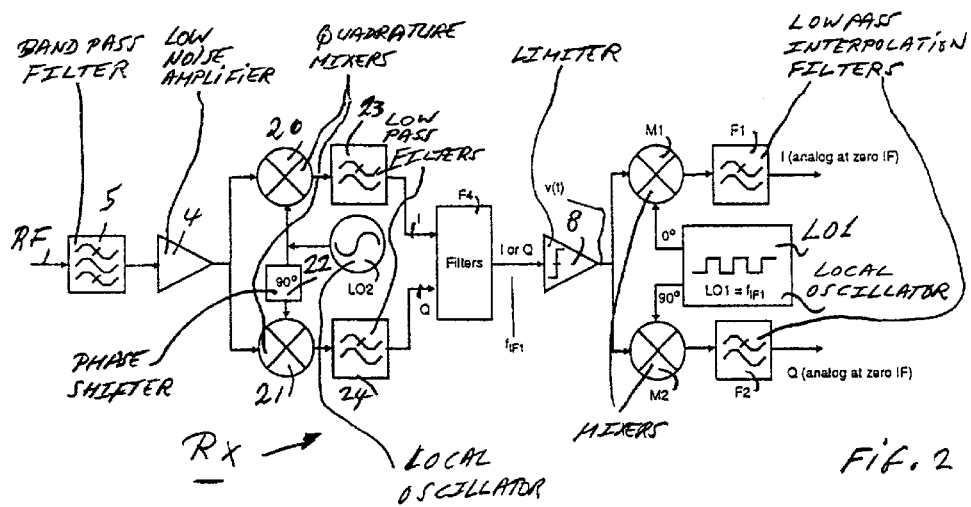
FIG. 2 is a block diagram of a second embodiment of a receiver according to the present invention.

FIG. 2 is a block diagram of a second embodiment of a receiver according to the present invention. In this embodiment, the receiver Rx is a low-IF receiver with two-step quadrature down-conversion from RF to zero-IF or base band. The receiver Rx comprises a quadrature down-conversion means, quadrature mixers 20 and 21. The mixers 20 and 21 are coupled to the local oscillator LO2, directly and through 90° phase shifter 22, respectively. The mixers 20 and 21 are further coupled to the limiter 8 through a cascade of low pass filters 23 and 24, and poly-phase filters F4.

Figure 3:
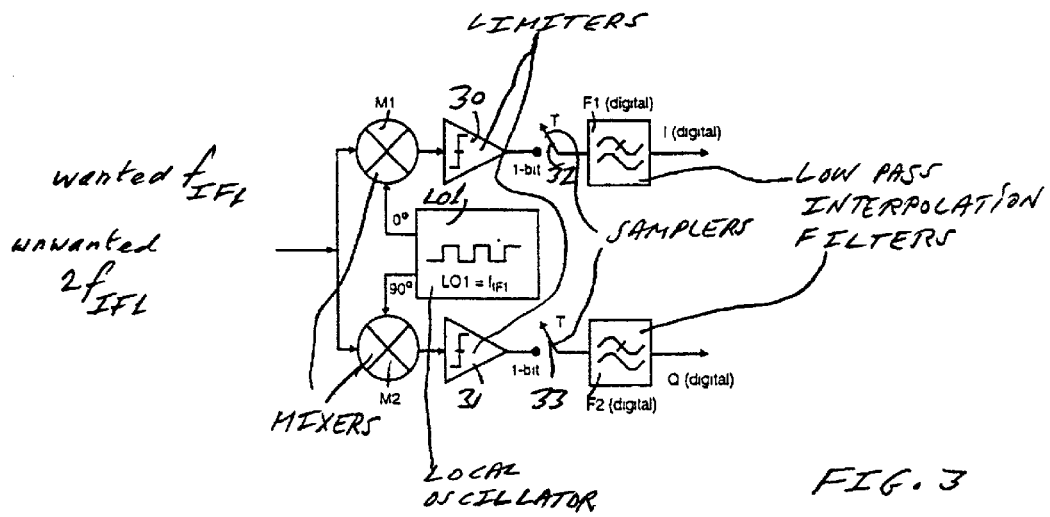
FIG. 3 shows I- and Q-sampling of a hard-limited 1-bit signal.
Figure 4:
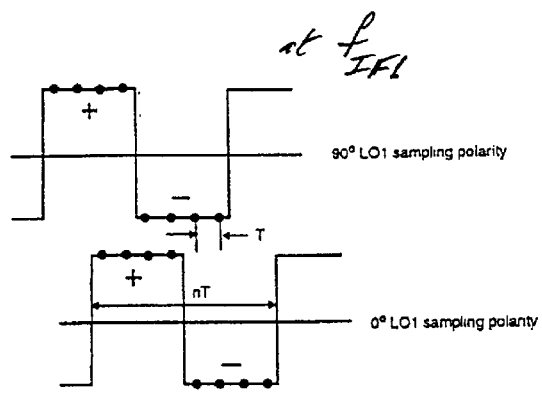
FIG. 4 shows I- and Q- sampler polarities, with eight samples per IF period.
Figure 5:
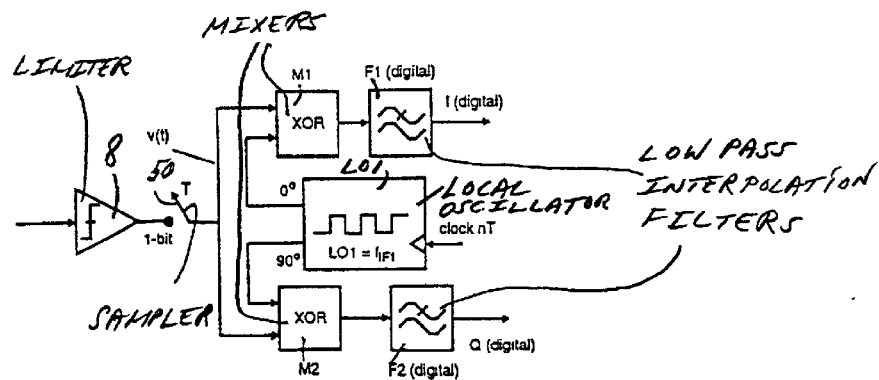
FIG. 5 shows an alternative embodiment of I- and Q-sampling of a hard-limited 1-bit signal.
Figure 6:
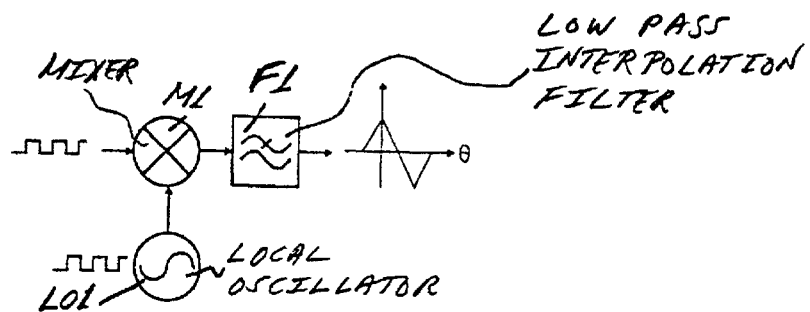
FIG. 6 shows square wave LO mixing, θ being a phase difference between mixer and LO input signals.
Figure 7:
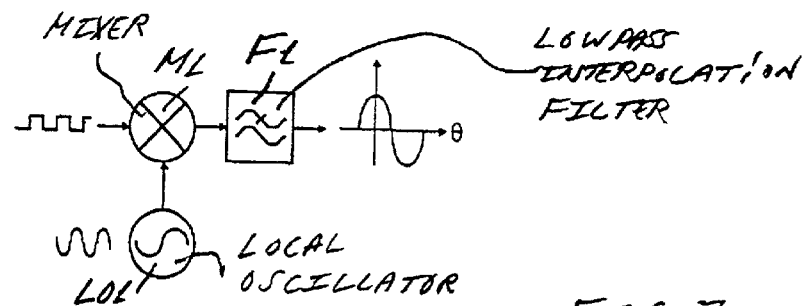
FIG. 7 shows sine wave LO mixing.
Figure 8:
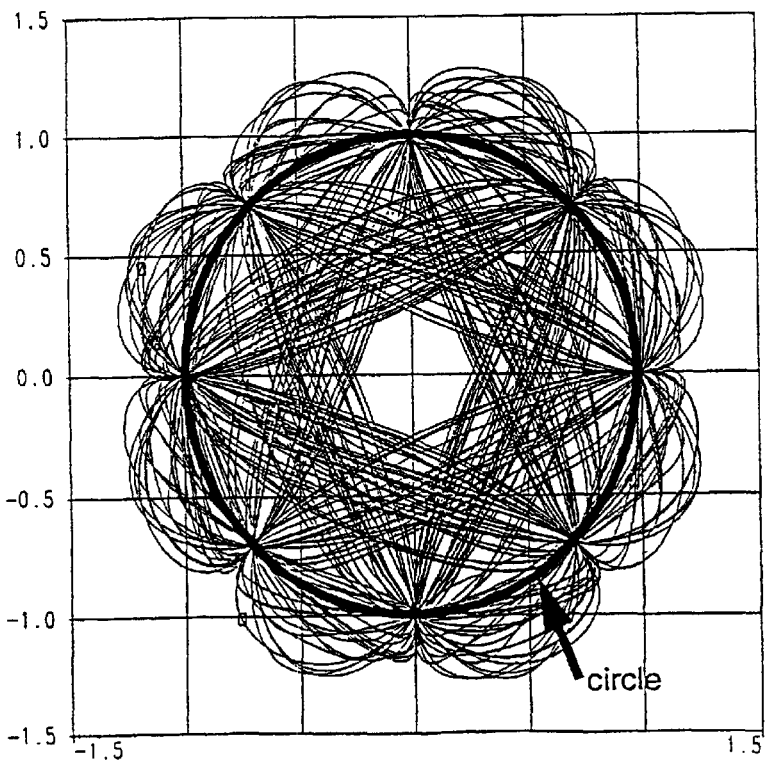
FIG. 8 shows the effect of hard-limiting of the IF, for a π/4 DQPSK signal constellation, with no distortion to the trajectories, when applying sine wave LO mixing.
Figure 9:
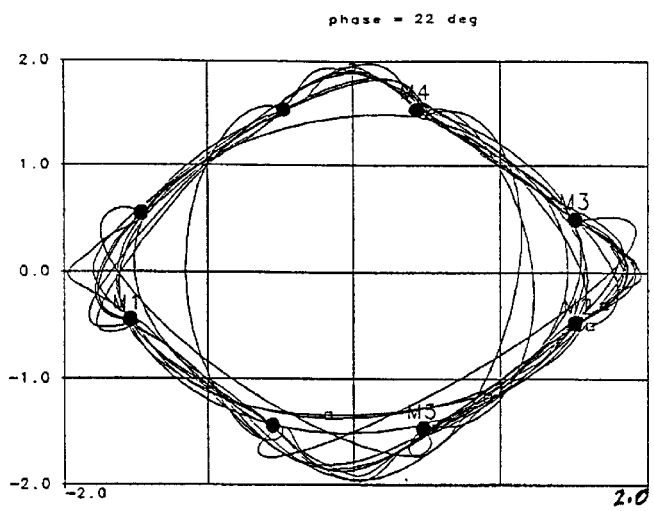
FIG. 9 shows the effect of hard-limiting of the IF, for a π/4 DQPSK signal constellation, with, due to distortion of the trajectories, the eight constellation points falling on a square instead of a circle, when applying square wave LO mixing.

In the double superhet receiver Rx of FIG. 1, and in the poly phase receiver Rx of FIG. 2, the noise spreading signal is a very low unwanted $2f_{IF1}$ frequency term at the output of the mixers M1 and M2. The hard-limited IF signal is mixed with a square wave LO. This is equivalent to mixing a non-limited IF signal with a sinusoidal LO, and then limiting the signal at the mixer output, as shown in FIG. 3, in which limiters 30 and 31 are shown instead of the limiter 8 as shown in FIGS. 1 and 2, and further samplers 32 and 33. The amplitude of the unwanted $2f_{IF1}$ term follows the wanted signal level, because it is a mixing product of the received signal. This eliminates the problem of having an AGC to keep the wanted signal and the unwanted noise-spreading signals at comparable levels. In a pure direct conversion zero IF concept, there is a possible problem that the added noise-spreading signal may be much larger than the wanted signal, so that special measures have to be taken. The advantage of mixing with a square wave oscillator is that the mixing and sampling can be done digitally as is further shown in FIGS. 4 and 5, and the signal processed digitally without an A/D converter. In FIG. 4, sampling of the samplers 30 and 32 is shown, with eight samples per period of the down-converted signal $f_{IF1}$. Alternatively, the mixing and sampling in FIG. 3 is done as shown in FIG. 5, a 1-output signal of the limiter 8 being sampled with the sampler 50, and the mixers M1 and M2 being exclusive-OR gates. The odd harmonics of the low IF signal are also down converted to zero IF by the LO odd harmonics, and they appear as phase and amplitude error in the modulation. FIG. 6 shows square wave LO mixing and FIG. 7 shows sine wave LO mixing. The output DC voltage (zero IF component) varies sinusoidally with the phase difference between the LO and the IF signals, if the LO is sinusoidal. For phase modulation, this mixing will produce a constellation that still lies on a circle as is shown in FIG. 8 for for π/4 DQPSK, and there is no demodulation phase error. However, in this case the mixer output signal quantization is more than 1-bit, and this signal has to be processed differently e.g. through a normal analog low pass filter, followed by A/D for digital demodulation. When the LO also is hard-limited, the DC output of the mixer varies triangularly with the phase difference, and the constellation for phase modulated signals will appear on a square. The phase difference between the constellation points are altered as shown in FIG. 9 for π/4 DQPSK, thereby creating errors in the demodulation phase. These errors are dependent on the phase difference between the LO and the unmodulated IF carrier. The maximum phase error in a constellation point is 4.08 degrees.

Figure 10:
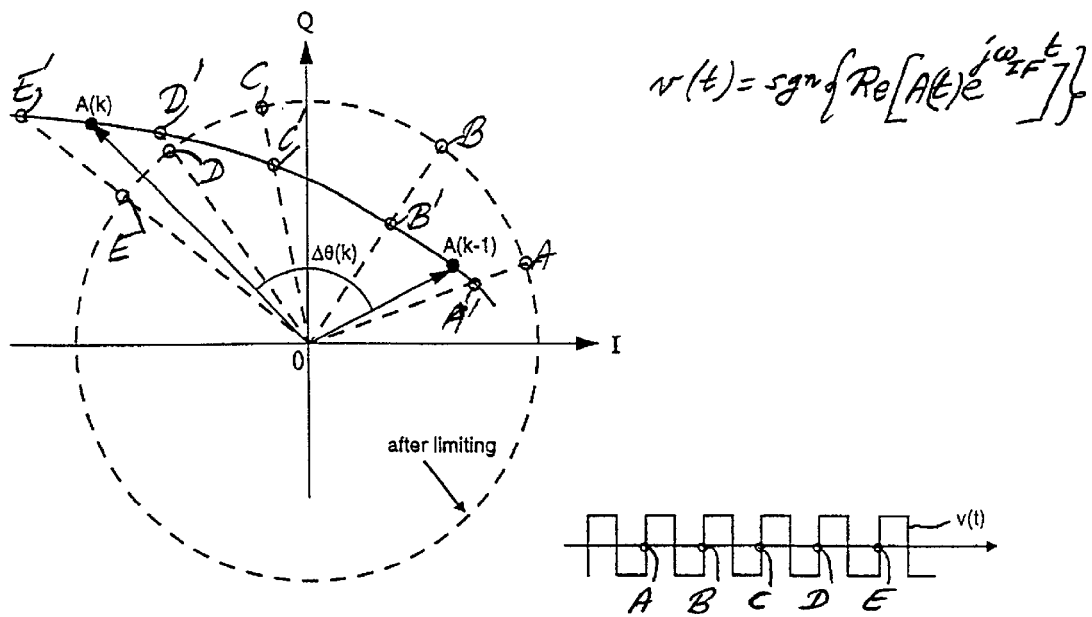
FIG. 10 shows the discrete phase due to hard limiting.

As shown in FIG. 10, the effect of hard limiting the IF signal is that the modulation phase becomes discrete, and averaged between the zero crossings of the carrier. After down conversion to zero IF, the modulation phase is interpolated at base band by filtering with F1 and F2 as shown in FIGS. 1 and 2. If the carrier zero crossings are spread too wide in time, i.e. for too low an IF, then the interpolation is not good. This can be quantitatively analyzed by measuring the spectral spill over from the $2f_{IF}$ component into the zero IF modulation band, and by measuring the differential phase error for π/4 DQPSK. The down conversion to zero IF can be done by linear mixing, i.e. by sine wave LO mixing as shown in FIG. 7, or by hard limited LO mixing as shown in FIG. 6. Further shown in FIG. 10 are magnitude and phase changes of the modulation vector magnitude A(k), before and after hard limiting.

Figure 11:
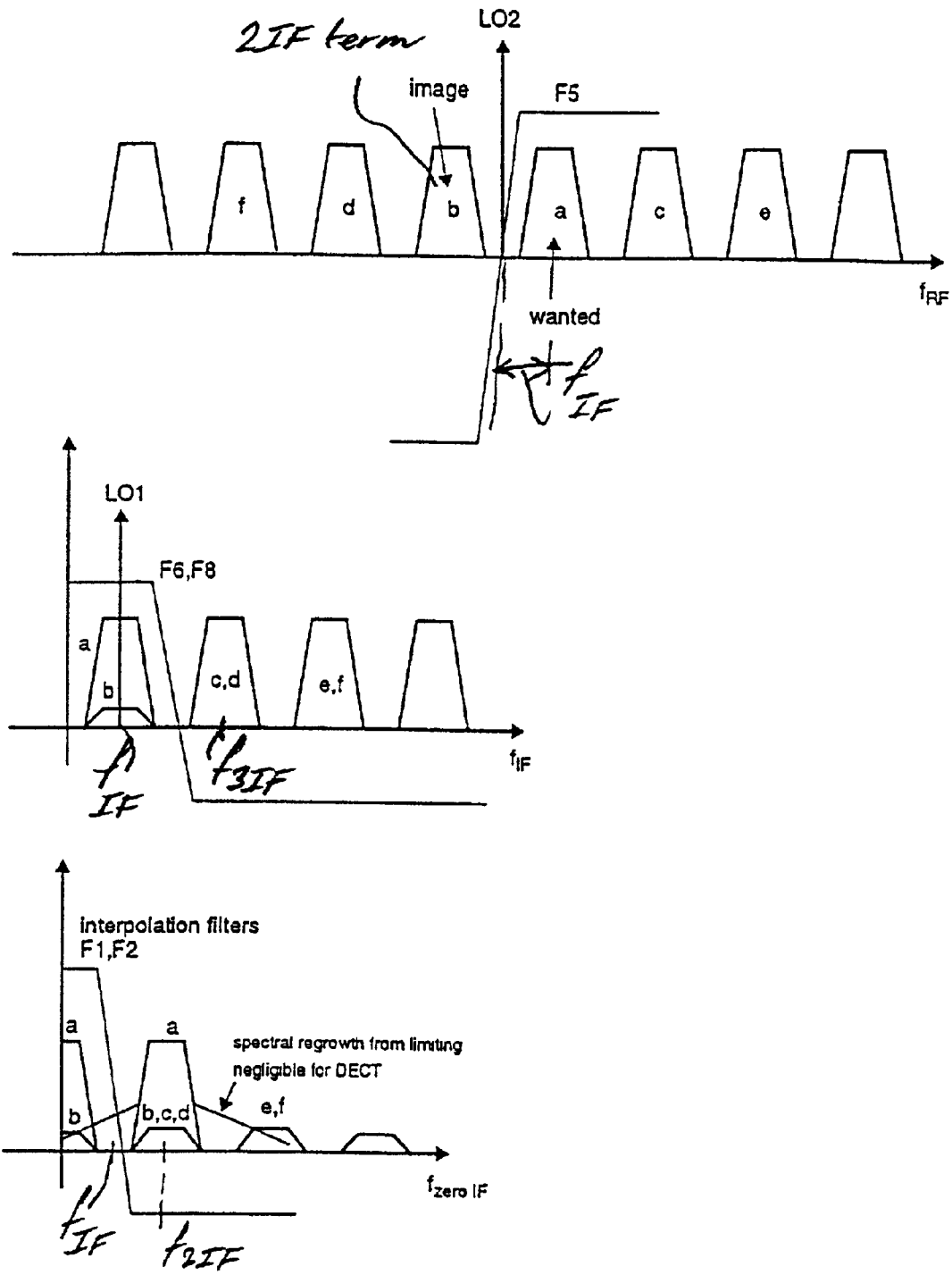
FIG. 11 shows DECT channels for a low IF poly phase receiver according to the present invention.
Figure 12:
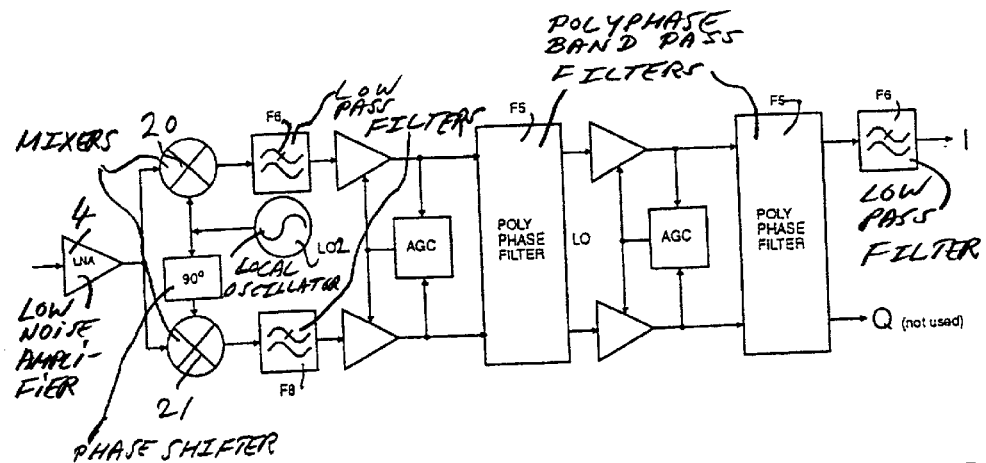
FIG. 12 shows implementation of filters in a poly phase receiver.

For DECT, the hard limited $2f_{IF}$ GFSK signal at 1.728 MHz, that is taken equal to the channel spacing, produces −32 dBc splatter into the zero IF base band (0–864 kHz). This is similar to adjacent channel interference because in DECT constant envelope modulation is applied. Therefore, $f_{IF}$ can be chosen half the channel spacing. The image frequency is then the adjacent channel b, as shown in FIG. 11. The image frequency is suppressed by polyphase base band filters F5 as shown in FIG. 12. The higher frequency terms e.g. c, d, e, f etc., are suppressed by low pas filters F6 and F8 as shown in FIG. 12. The higher frequency terms should be suppressed before the hard limiting, otherwise additional interference noise will fall into the wanted signal band. After down conversion to zero IF, the unwanted $2f_{IF}$ component is removed by low pass filtering that also does phase interpolation.

FIG. 12 shows filter implementations of the filters F4 as shown in FIG. 2. Shown are the poly phase band pass filters F5, and the low pass filters F6 and F8, and further amplifiers and AGC controllers. Instead of the I output, the Q output can be used.

Figure 13:
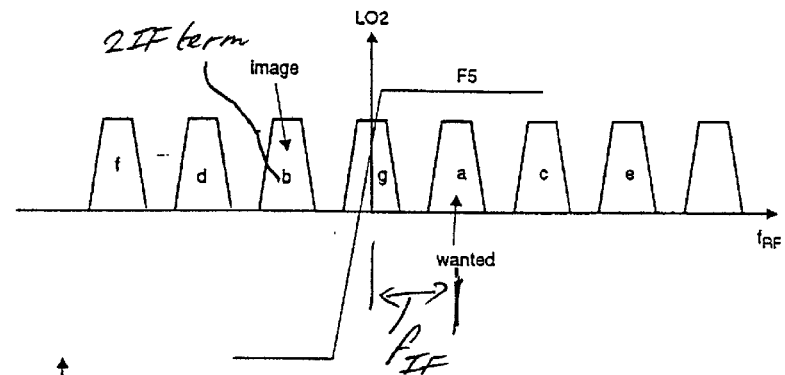
FIG. 13 shows PWT channels for a low IF poly phase receiver according to the present invention.
Figure 13:
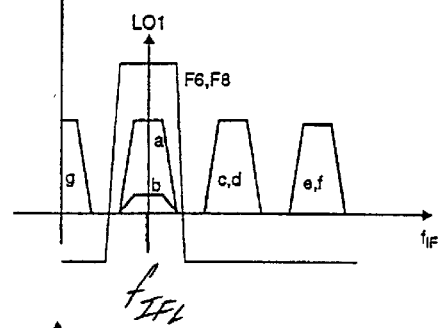
Figure 13:
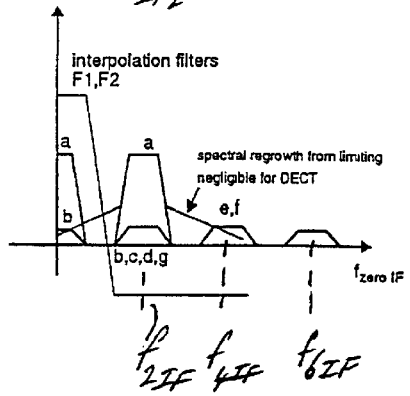

For PWT, the $2f_{IF}$ term at 1.25 MHz, produces −12 dBc spectral splatter into the zero IF wanted signal. The corresponding differential phase error is about 15%. This will result in about 1 dB loss in receiver sensitivity. This loss can be reduced by increasing $f_{IF}$ by moving the first LO, LO2, into the middle of an adjacent channel, for instance, as shown in FIG. 13. Here, the $2f_{IF}$ term is 2 channels away (2.5 MHz), and produces much less spectral splatter into the wanted signal at zero IF. The phase interpolation filters F1 and F2 should exhibit a linear phase over the bandwidth of the zero IF wanted signal. The filters F1 and F2 also remove the high frequency components of the quantization noise.

Figure 14:
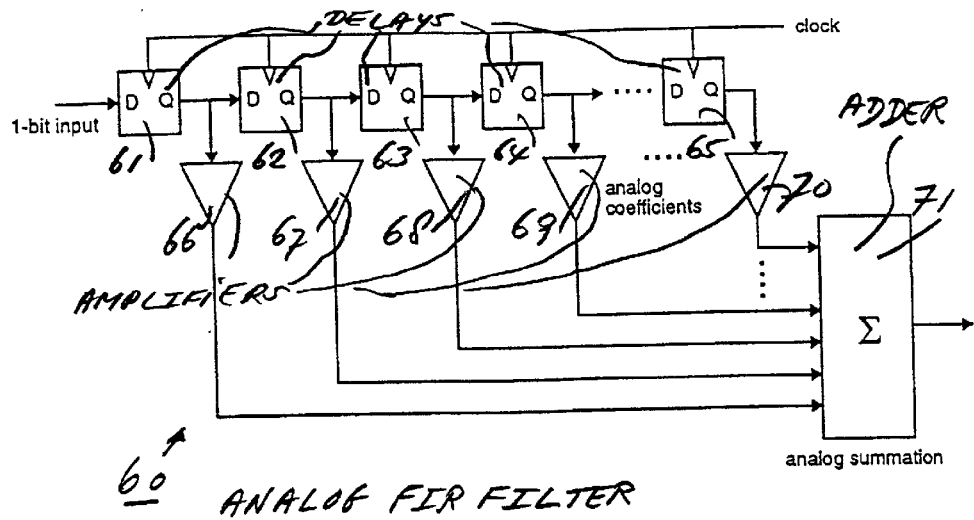
FIG. 14 shows an analog implementation of the low pass interpolation filters.

FIG. 14 shows an analog implementation of the filters F1 and F2. An advantage of analog phase interpolation is that down conversion to zero-IF can be done using sine wave LO mixing, thereby eliminating the modulation phase error. An almost ideal phase interpolation is possible if $f_{IF}$ is sufficiently large. Additionally, the A/D-converters (not shown)

at the filter outputs could have about 5-bit quantization. The analog filtering is done using an analog FIR filter, as shown in FIG. 14. Since the input quantization is 1-bit for the hard limited LO mixing, delays 61, 62, 63, 64, and 65 in the FIR filter 60 can be a digital shift register with parallel output at outputs of amplifiers 66, 67, 68, 69, and 70, summed by analog adder 71. The tap coefficients and summation are analog. The filter output is discrete analog. An advantage of this technique is that the same filter can be used in the transmitter data shaping at a lower sampling rate with fewer taps, for TDMA-systems. In DECT it can be used directly as a Gaussian filter.

Figure 15:
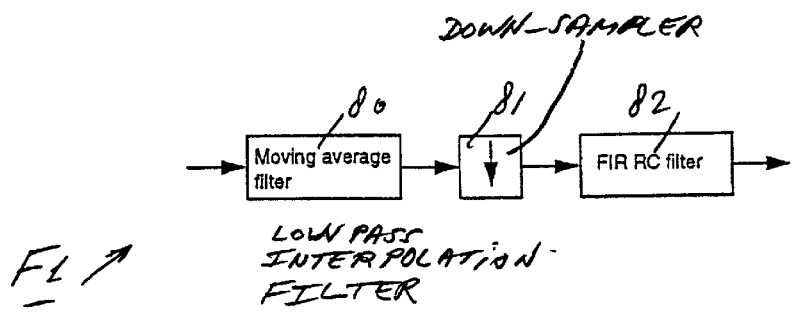
FIGS. 15 and 16 show a digital implementation of the low pass interpolation filters.
Figure 16:
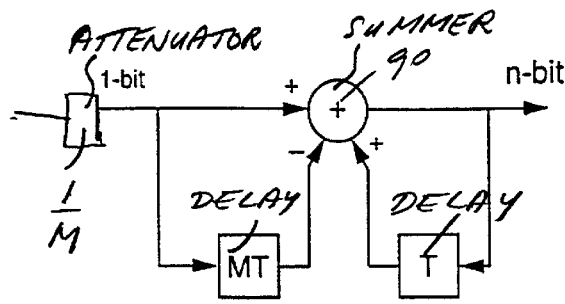

A great advantage of having a 1-bit quantization for the zero IF signal is that the phase interpolation and suppression of the high frequency quantization, can be done with a simple moving average filter as shown in FIGS. 15 and 16. In FIG. 15, the filter F1 is shown, a cascade of a moving average filter 80, a down-sampler 81, and a FIR raised cosine filter 82. In FIG. 16, the moving average filter is shown in more detail, a cascade of an attenuator 1/M and a summer 90, a forward delay MT, and a backward delay T, n being the output word length in bit. The accumulator is actually a counter, and gives an n-bit digital filtered output. The sampling rate at the output is greatly reduced, for further digital phase interpolation filtering by a raised cosine filter, for instance. The moving average filter alone is not sufficient for phase interpolation. It mainly suppresses the high frequency components of the 1-bit quantization noise.

The 1-bit quantization noise is very strong at high frequencies. For a +13 dBm output power from a hard limiter (1 Volt into 50Ω), the power of the zero-IF wanted signal is 4.8 dBm and the power of the $2f_{IF}$ band is 10.4 dBm. The total power of all frequencies above $510f_{IF}$ is 20 dB below the wanted zero-IF power level. These results are for a PWT signal at $f_{IF}$=1.152 MHz. This does not mean that the moving average filter has to run at an extremely high sampling rate. Running at a lower sampling rate produces aliasing of some of the high frequency quantization noise i.e. they fold into the zero IF wanted band. This aliasing is in addition to the peak 4.08° modulation phase error from the modulation envelope distortion (square constellation). The sampling rate is kept just low enough so that the aliasing produces an acceptable DPE (differential phase error). The aliasing is shown in FIG. 17. Further, sampling rate has to be increased in proportion to $f_{IF}$. Therefore a digital filter may not be useful if $f_{IF}$ is made very large.

FIG. 18 shows an alternative embodiment of the receiver Rx according to the present invention, the receiver being a direct conversion, single step down-conversion zero-IF receiver. The receiver comprises limiters 92 and 93, to inputs of which a low frequency generator 95 injects, in adders 96 and 97, respectively, a low frequency signal f1. Further shown are DC-offset or reset circuits 98, 99, 10, and 101, amplifiers 102 and 103, and an AGC controller 104. The local oscillator LO2 directly converts the RF signal to zero-IF. A problem with this embodiment is that the noise-spreading signal must be controlled in order not to overload the IF sections. Also, it must be sufficiently rejected by the time it reaches the demodulator input, where it should be small in order to have good receiver sensitivity at the minimum operating RF level. DC-offset at the mixer outputs e.g. due to LO re-radiation, and due to direct detection, have to be removed to a large extent (reduced below co-channel interference level), before the hard limiting. The DC-coupled gain and filter blocks between the mixers and limiters might saturate, or the limiter input may saturate, due to amplification of the DC-offset that is usually orders of magnitude larger than the minimum operating signal level. Some DC-offset compensation can still be done after the limiter if signal saturation and compression can be avoided up to the limiter input. Any received signal based AGC action on the noise-spreading signal should be avoided as the DC-offset level after the limiter will change. The DC-offset compensation is done in the guard space of the TDMA slots, when no signal is being received, and is frozen during the RF burst. DC-offset compensation has to be substantially done before any AGC on the input signal. The noise-spreading unwanted signal should be added after the AGC.

In FIG. 19, an alternative embodiment of the receiver Rx according to the present invention, the receiver being a direct conversion, single step down-conversion zero-IF receiver as shown in FIG. 18, but without the generator 95. In this embodiment, a beacon signal BC, outside a frequency band FB, acts as the noise spreading signal. Shown is the wnated signal WS, at a distance f1 of the beacon signal BC, f1 being the same frequency as the frequency generated by the generator 95 in FIG. 18.

In view of the foregoing it will be evident to a person skilled in the art that various modifications may be made within the spirit and the scope of the invention as hereinafter defined by the appended claims and that the invention is thus not limited to the examples provided. The word "comprising" does not exclude the presence of other elements or steps than those listed in a claim.

What is claimed is:

1. A receiver for receiving an angle modulated radio frequency signal, said receiver comprising:

first down-conversion means for down-converting said received angle modulated radio frequency signal to an intermediate frequency angle modulated signal;

limiting means for generating a limited signal from said intermediate frequency angle modulated signal;

second down-conversion means for down-converting said limited signal to an in-phase and a quadrature second down-conversion means for down converting said limited signal to an in-phase and a quadrature zero intermediate frequency signal;

low pass interpolation filtering means for interpolating said in-phase and quadrature zero intermediate frequency signals; and demodulation means for producing a demodulated signal from said interpolated in-phase and quadrature zero intermediate frequency signals, said intermediate frequency being chosen such that said limited signal comprises an unwanted signal at twice said intermediate frequency that acts as a noise spreading signal for spectrally spreading of quantization noise generated by said limiting means, and a cut-off frequency of said low pass interpolation filtering means being chosen such that said unwanted signal and said spread quantization noise are suppressed.

2. A receiver as claimed in claim 1, wherein said limiting means is a hard limiter that generates a digital output stream of single bit words.

3. A receiver as claimed in claim 1, wherein said limiting means comprises a soft limiter, and a fist analog-to-digital converter coupled to said soft limiter, said first analog-to-digital converter generating a digital output stream of words of at least two bits.

4. A receiver as claimed in claim 3, wherein said soft limiter is a logarithmic gain amplifier.

5. A receiver as claimed in claim 1, wherein said low pass interpolation filtering means are analog filtering means, and said receiver comprises a second and third analog-to-digital converter for sampling said in-phase and quadrature zero intermediate frequency signals.

6. A receiver as claimed in claim 5, wherein said analog filtering means are finite impulse response filtering means.

7. A receiver as claimed in claim 1, wherein said low pass interpolation filtering means are digital filtering means, and said receiver comprises a first and a second sampler coupled between said second down-conversion means and said digital filtering means.

8. A receiver as claimed in claim 7, wherein said digital filtering means comprises a cascade of moving average filtering means, down sampling means, and reduced sampling rate filtering means.

9. A receiver as claimed in claim 1, wherein said second down-conversion means comprises a first mixer producing said in-phase zero intermediate frequency signal, and a second mixer producing said quadrature zero intermediate frequency signal, and local oscillator means coupled to said first and second mixer, said local oscillator means providing ninety degrees shifted oscillation signals to the first and second mixer, respectively, at said intermediate frequency.

10. A receiver as claimed in claim 9, wherein said local oscillator signals are sine wave signals.

11. A receiver as claimed in claim 9, wherein said local oscillator signals are square wave signals.

12. A receiver as claimed in claim 1, wherein said second down-conversion means comprises a first exclusive-OR gate producing said in-phase zero intermediate frequency signal, and a second exclusive OR-gate producing said quadrature zero intermediate frequency signal, and local oscillator means coupled to said first and second mixers, said local oscillator means providing ninety degrees shifted square wave oscillation signals to the first and second exclusive-OR gate, respectively, at said intermediate frequency.

13. A receiver as claimed in claim 1, said receiver comprising filtering means between said first down-conversion means and said limiting means, said filtering means suppressing an image frequency of a wanted angle modulated signal and higher frequency channels that are spectrally beyond said wanted angle modulated signal.

14. A receiver as claimed in claim 13, wherein said filtering means comprises polyphase filtering means to suppress said image frequency.

15. A receiver as claimed in claim 14, wherein said intermediate frequency is chosen such that said image frequency is spaced from said wanted angle modulated signal at once said intermediate frequency and said filtering means comprises low pass filtering means to suppress said higher frequency channels.

16. A receiver as claimed in claim 14, wherein said intermediate frequency is chosen such that said image frequency is spaced from said wanted angle modulated signal at once said intermediate frequency and said filtering means comprises band pass filtering means to suppress said higher frequency channels.

17. A receiver for receiving an angle modulated radio frequency signal, said receiver comprising:
first down-conversion means for down-converting said received single modulated radio frequency signal to an intermediate frequency angle modulated signal;
second down-conversion mean for down-converting said intermediate frequency angle modulated signal to an in-phase and a quadrature zero intermediate frequency signal;
limiting means for generating a limited in-phase and quadrature signal from said in-phase and quadrature zero intermediate frequency signals;
low pass interpolation filtering means for interpolating said limited in-phase and quadrature signals; and
demodulation means for producing a demodulated signal from said interpolated limited in-phase and quadrature signals,
said intermediate frequency being chosen such that said limited in-phase and quadrature signals comprise an unwanted signal at twice said intermediate frequency that acts as a noise spreading signal for spectrally spreading of quantization noise generated by said limiting means, and a cut-off frequency of said low pass interpolation filtering means being chosen such that said unwanted signal and said spread quantization noise are suppressed.

18. A receiver for receiving an angle modulated radio frequency signal, said receiver comprising:
quadrature down-conversion means for down-converting said received angle modulated radio frequency signal to an in-phase and quadrature zero intermediate frequency angle modulated signal;
limiting means for generating limited signals from said zero intermediate frequency angle modulated signals;
signal injection means for injecting a low frequency signal into inputs of said limiting means;
low pass interpolation filtering means for interpolating said in-phase and quadrature zero intermediate frequency signals; and
demodulation means for producing a demodulated signal from said limited signals.
said low frequency signal acting as a noise spreading signal for spectrally spreading of quantization noise generated by said limiting means, and a cut-off frequency of said low pass interpolation filtering means being chosen such that said spread quantization noise is suppressed.

19. A receiver as claimed in claim 18, said receiver comprising DC-offset cancellation means, that are distributed over quadrature reception paths of said receiver, for substantially canceling DC-offsets in said quadrature reception paths before said limiting means.

20. A receiver for receiving an angle modulated ratio frequency signal and a beacon signal outside a ratio frequency band comprising said angle modulated radio frequency signal, said receiver comprising:
quadrature down-conversion means for down-converting said received angle modulated radio frequency signal to an in-phase and quadrature zero intermediate frequency angle modulated signal, and for down-converting said received beacon signal to a zero intermediate frequency beacon signal;
limiting means for generating limited signals from said zero intermediate frequency angle modulated signals;
signal injection means for injecting said beacon signal into inputs of said limiting means;
low pass interpolation filtering means for interpolating said in-phase and quadrature zero intermediate frequency signals; and
demodulation means for producing a demodulated signal from said limited signals,
said beacon signal acting as a noise spreading signal for spectrally spreading of quantization noise generated by said limiting means, and a cut-off frequency of said low pass interpolation filtering means being chosen such that said spread quantization noise is suppressed.

* * * * *